US012621581B2

(12) United States Patent (10) Patent No.: US 12,621,581 B2

Collins (45) Date of Patent: May 5, 2026

(54) RESET GATE FOR PHOTODIODE

(71) Applicant: SEMICONDUCTOR COMPONENTS INDUSTRIES, LLC, Scottsdale, AZ (US)

(72) Inventor: David James Collins, Fishkill, NY (US)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 65 days.

(21) Appl. No.: 18/668,517

(22) Filed: May 20, 2024

(65) Prior Publication Data

US 2025/0358537 A1 Nov. 20, 2025

(51) Int. Cl.
*H04N 25/532* (2023.01)
*H04N 25/621* (2023.01)
*H10F 39/00* (2025.01)
*H10F 39/18* (2025.01)

(52) U.S. Cl.
CPC ......... *H04N 25/532* (2023.01); *H04N 25/623* (2023.01); *H10F 39/1865* (2025.01); *H10F 39/80377* (2025.01)

(58) Field of Classification Search
CPC H04N 25/532; H04N 25/623; H10F 39/1865; H10F 39/80377
See application file for complete search history.

(56) References Cited

U.S. PATENT DOCUMENTS

| | | | | |
|---|---|---|---|---|
| 2007/0012917 A1* | 1/2007 | McKee | ................... | H10F 39/18 |
| | | | | 257/E27.131 |
| 2007/0069258 A1* | 3/2007 | Ahn | .................... | H10F 39/8037 |
| | | | | 257/292 |
| 2010/0243864 A1* | 9/2010 | Itonaga | ................. | H10F 39/014 |
| | | | | 257/292 |
| 2014/0008708 A1* | 1/2014 | Lim | .................... | H10F 39/8037 |
| | | | | 257/292 |
| 2017/0025452 A1* | 1/2017 | Sekisawa | .......... | H10F 39/80377 |

FOREIGN PATENT DOCUMENTS

| | | | | | |
|---|---|---|---|---|---|
| CN | 101789437 A | * | 7/2010 | | |
| CN | 101859787 A | * | 10/2010 | .......... | H10F 39/807 |
| KR | 20020022248 A | * | 3/2002 | ......... | H10F 39/8033 |
| KR | 20060010888 A | | 2/2006 | | |
| WO | 2007066944 A1 | | 2/2006 | | |

* cited by examiner

*Primary Examiner* — Timothy J Henn
(74) *Attorney, Agent, or Firm* — Brake Hughes Bellermann LLP

(57) ABSTRACT

A buried channel that partially covers a reset gate channel of a pixel for a light sensor is disclosed. The buried channel can lower a potential barrier between a photodiode and the reset gate so that charge can be drained from the photodiode region faster during a reset period. This may result in a shorter reset period that can increase the frame rate of a global shutter.

20 Claims, 12 Drawing Sheets

[A]

[B]

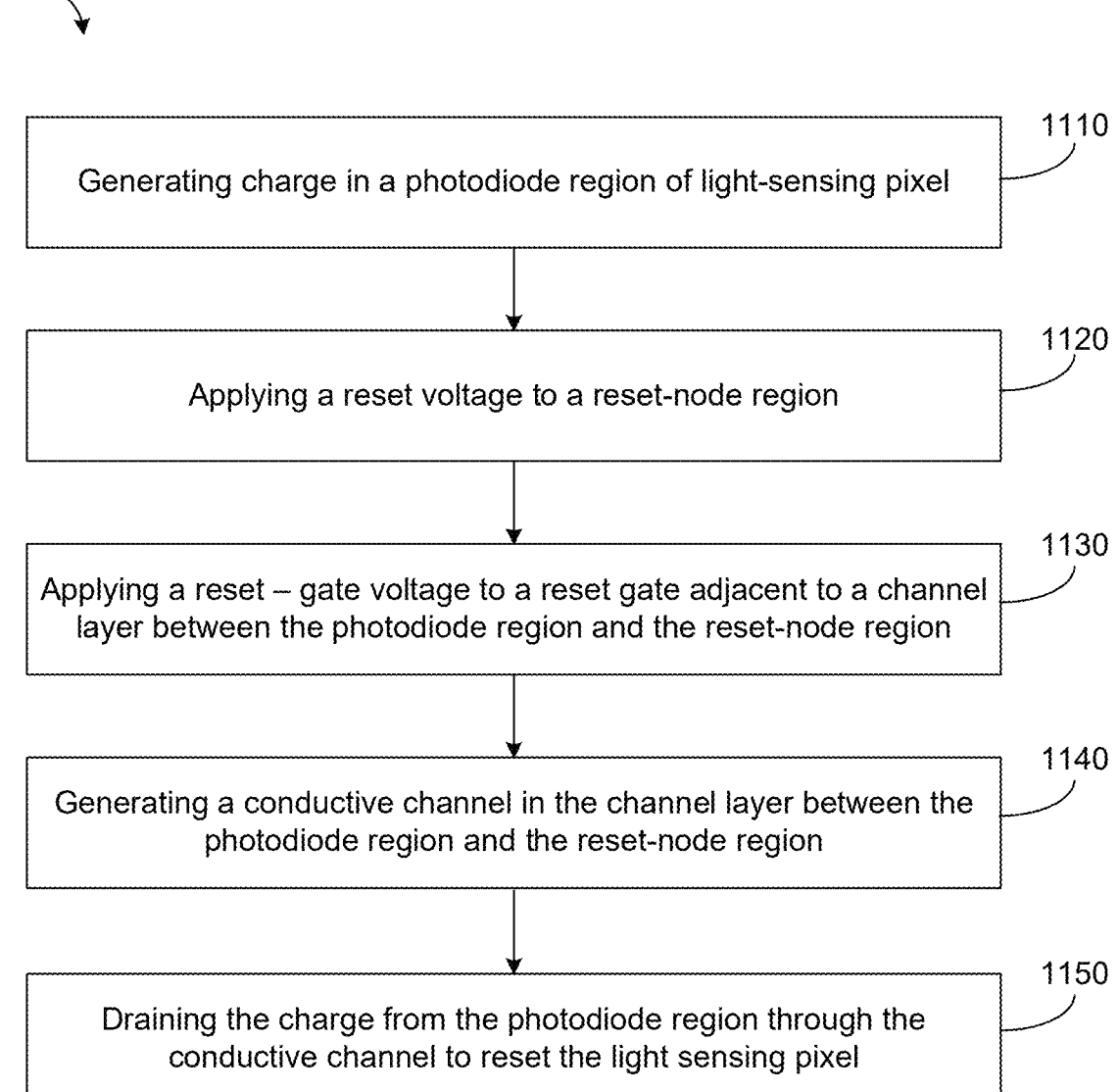

1100

1110
Generating charge in a photodiode region of light-sensing pixel

1120
Applying a reset voltage to a reset-node region

1130
Applying a reset – gate voltage to a reset gate adjacent to a channel layer between the photodiode region and the reset-node region 1140
Generating a conductive channel in the channel layer between the photodiode region and the reset-node region 1150
Draining the charge from the photodiode region through the conductive channel to reset the light sensing pixel

FIG. 11

RESET GATE FOR PHOTODIODE

FIELD OF THE DISCLOSURE

The present disclosure relates to an image sensor and more specifically to a light-sensing pixel for the image sensor.

BACKGROUND

An image sensor includes a pixel array that can be implemented as photodiodes arranged in rows and columns. Each photodiode is configured to measure photons during an exposure (i.e., frame). The photodiodes may be addressed row-by-row to capture an image in what is known as a rolling shutter. One problem with the rolling shutter is that objects that move faster than the frame rate can appear distorted in images captured by the pixel array. In other words, a fast-moving object may change positions in the time it takes to scan from the first row to the last row. To eliminate this effect, a global shutter may be used. In a global shutter image sensor, all photodiodes of the pixel array are exposed simultaneously before reading them out, and after a readout process, all photodiodes are reset before exposing the next frame. While being able to accurately image a fast-moving object, a global shutter can reduce the frame rate of the image sensor.

SUMMARY

The present disclosure describes a light-sensing pixel that can help to increase the frame rate of a global shutter image sensor based on its reduced potential barrier between a photodiode and a reset gate, which can make resetting the pixel between frames faster.

In some aspects, the techniques described herein relate to a light-sensing pixel, including: a channel layer adjacent to a photodiode region, adjacent to a reset-node region, and extending a channel length to fill a space (i.e., area, volume) between the photodiode region and the reset-node region; a reset gate adjacent to a top surface of the channel layer and extending the channel length so that a reset-gate voltage applied to the reset gate generates a conductive channel between the photodiode region and the reset-node region; and a photodiode-extension layer adjacent to a bottom surface of the channel layer opposite the top surface, the photodiode-extension layer extending from the photodiode region by an extension length that is less than the channel length.

In some aspects, the techniques described herein relate to a light-sensing pixel including: a photodiode configured to generate charge based on received light; and a reset transistor coupled between the photodiode and a reset-node, the reset transistor including: a reset gate; a channel layer adjacent to the reset gate at a top surface, the channel layer configured to generate a conductive channel between the photodiode and the reset-node while a reset-gate voltage is applied to the reset gate; and a buried channel at a bottom surface of the channel layer opposite the top surface, the buried channel having an extension length that is less than a channel length of the channel layer in a direction aligned with the conductive channel.

In some aspects, the techniques described herein relate to a method for resetting a light-sensing pixel, the method including: generating charge in a photodiode region of the light-sensing pixel; applying a reset voltage to a reset-node region of the light-sensing pixel, the reset-node region separated from the photodiode region by a channel layer, the light-sensing pixel including a photo-diode extension layer partially covering a bottom surface of the channel layer; applying a reset-gate voltage to a reset gate adjacent to the channel layer; generating a conductive channel between the photodiode region and the reset-node region in response to the reset-gate voltage; and draining the charge from the photodiode region through the conductive channel to reset the light-sensing pixel.

The foregoing illustrative summary, as well as other exemplary objectives and/or advantages of the disclosure, and the manner in which the same are accomplished, are further explained within the following detailed description and its accompanying drawings.

BRIEF DESCRIPTION OF THE DRAWINGS

FIG. 11 is a flowchart of a method for resetting a light-sensing pixel according to an implementation of the present disclosure.

The components in the drawings are not necessarily to scale relative to each other. Like reference numerals designate corresponding parts throughout the several views.

DETAILED DESCRIPTION

Embodiments of the present technology relate to image sensors. It will be recognized by one skilled in the art that the present exemplary embodiments may be practiced without some or all of these specific details. In other instances, well-known operations have not been described in detail in order not to unnecessarily obscure the present embodiments.

Electronic devices such as digital cameras, computers, cellular telephones, and other electronic devices may include image sensors that gather incoming light to capture an image. The image sensors may include arrays of pixels. The pixels in the image sensors may include photosensitive elements such as photodiodes that convert the incoming light into image signals. Image sensors may have any number of pixels (e.g., hundreds or thousands or more). A typical image sensor may, for example, have hundreds or thousands or millions of pixels (e.g., megapixels). Image sensors may include control circuitry such as circuitry for operating the pixels and readout circuitry for reading out image signals corresponding to the electric charge generated by the photosensitive elements.

Figure 1:
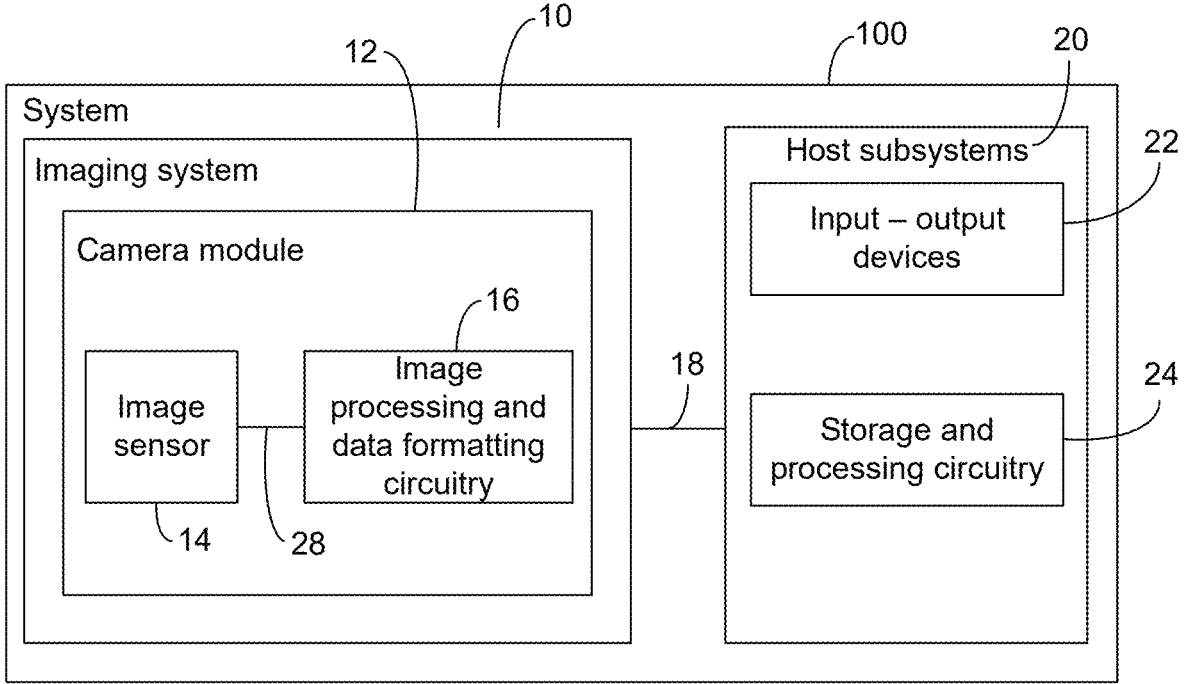
FIG. 1 is a diagram of an illustrative imaging and response system including an imaging system that uses an image sensor to capture images.

FIG. 1 is a diagram of an illustrative imaging and response system including an imaging system that uses an image sensor to capture images. System 100 of FIG. 1 may be an electronic device such as a camera, a cellular telephone, a video camera, or other electronic device that captures digital image data, may be a vehicle safety system (e.g., an active braking system or other vehicle safety system), or may be a surveillance system.

As shown in FIG. 1, system 100 may include an imaging system such as imaging system 10 and host subsystems such as host subsystem 20. Imaging system 10 may include camera module 12. Camera module 12 may include one or more image sensors 14, such as in an image sensor array integrated circuit, and one or more lenses. During image capture operations, each lens may focus light onto an associated image sensor 14. Image sensor 14 may include photosensitive elements (i.e., image sensor pixels) that convert the light into analog data. Image sensors may have any number of pixels (e.g., hundreds, thousands, millions, or more). A typical image sensor may, for example, have millions of pixels (e.g., megapixels).

Each image sensor in camera module 12 may be identical or there may be different types of image sensors in a given image sensor array integrated circuit. In some examples, image sensor 14 may further include bias circuitry (e.g., source follower load circuits), sample and hold circuitry, correlated double sampling (CDS) circuitry, amplifier circuitry, analog-to-digital converter circuitry, data output circuitry, memory (e.g., buffer circuitry), and/or address circuitry.

Still and video image data from image sensor 14 may be provided to image processing and data formatting circuitry 16 via path 28. Image processing and data formatting circuitry 16 may be used to perform image processing functions such as data formatting, adjusting white balance and exposure, implementing video image stabilization, or face detection. Image processing and data formatting circuitry 16 may additionally or alternatively be used to compress raw camera image files if desired (e.g., to Joint Photographic Experts Group or JPEG format).

In one example arrangement, such as a system on chip (SoC) arrangement, sensor 14 and image processing and data formatting circuitry 16 are implemented on a common semiconductor substrate (e.g., a common silicon image sensor integrated circuit die). If desired, sensor 14 and image processing circuitry 16 may be formed on separate semiconductor substrates. For example, sensor 14 and image processing circuitry 16 may be formed on separate substrates that have been stacked.

Imaging system 10 may convey acquired image data to host subsystem 20 over path 18. Host subsystem 20 may include input-output devices 22 and storage processing circuitry 24. Host subsystem 20 may include processing software for detecting objects in images, detecting motion of objects between image frames, determining distances to objects in images, or filtering or otherwise processing images provided by imaging system 10. For example, image processing and data formatting circuitry 16 of the imaging system 10 may communicate the acquired image data to storage and processing circuitry 24 of the host subsystems 20.

If desired, system 100 may provide a user with numerous high-level functions. In a computer or cellular telephone, for example, a user may be provided with the ability to run user applications. For these functions, input-output devices 22 of host subsystem 20 may include keypads, input-output ports, buttons, and displays and storage and processing circuitry 24. Storage and processing circuitry 24 of host subsystem 20 may include volatile and/or nonvolatile memory (e.g., random-access memory, flash memory, hard drives, solid-state drives, etc.). Storage and processing circuitry 24 may additionally or alternatively include microprocessors, microcontrollers, digital signal processors, and/or application specific integrated circuits.

Figure 2:
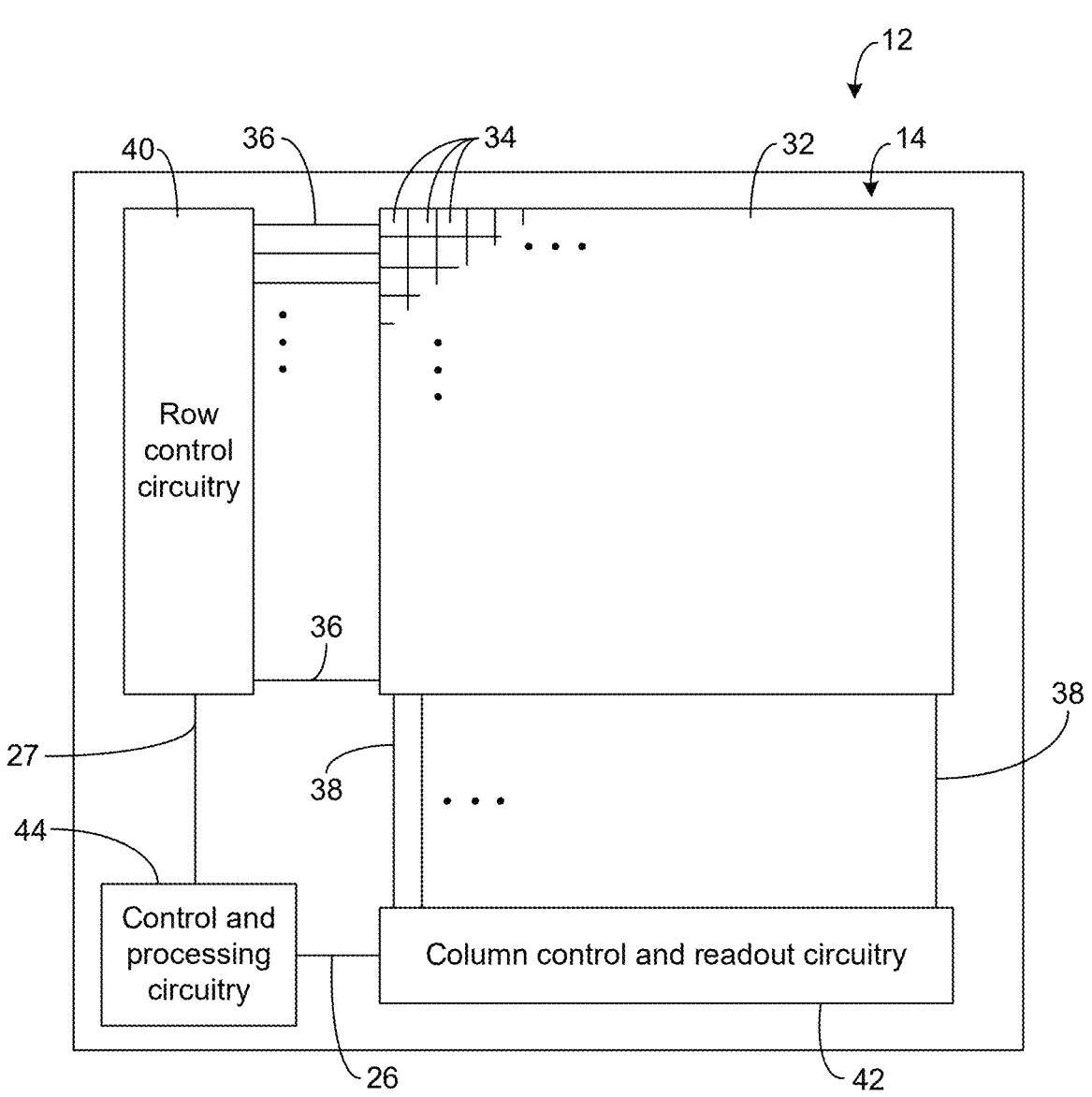
FIG. 2 is an example of an arrangement of the image sensor shown in FIG. 3.

An example of an arrangement of image sensor 14 of FIG. 1 is shown in FIG. 2. As shown in FIG. 2, image sensor 14 may include control and processing circuitry 44. Control and processing circuitry 44 (sometimes referred to as control and processing logic) may be part of image processing and data formatting circuitry 16 in FIG. 1 or may be separate from circuitry 16. Image sensor 14 may include a pixel array such as array 32 of pixels 34 (sometimes referred to herein as image sensor pixels, imaging pixels, or image pixels). Control and processing circuitry 44 may be coupled to row control circuitry 40 via control path 27 and may be coupled to column control and readout circuits 42 via data path 26.

Row control circuitry 40 may receive row addresses from control and processing circuitry 44 and may supply corresponding row control signals to image pixels 34 over one or more control paths 36. The row control signals may include pixel reset control signals, charge transfer control signals, blooming control signals, row select control signals, dual conversion gain control signals, or any other desired pixel control signals.

Column control and readout circuitry 42 may be coupled to one or more of the columns of pixel array 32 via one or more conductive lines such as column lines 38. A given column line 38 may be coupled to a column of image pixels 34 in image pixel array 32 and may be used for reading out image signals from image pixels 34 and for supplying bias signals (e.g., bias currents or bias voltages) to image pixels 34. In some examples, each column of pixels may be coupled to a corresponding column line 38. For image pixel readout operations, a pixel row in image pixel array 32 may be selected using row driver circuitry 40 and image data associated with image pixels 34 of that pixel row may be read out by column readout circuitry 42 on column lines 38. Column readout circuitry 42 may include column circuitry such as column amplifiers for amplifying signals read out from array 32, sample and hold circuitry for sampling and storing signals read out from array 32, analog-to-digital converter circuits for converting read out analog signals to corresponding digital signals, or column memory for storing the readout signals and any other desired data. Column control and readout circuitry 42 may output digital pixel readout values to control and processing logic 44 over line 26.

Array 32 may have any number of rows and columns. In general, the size of array 32 and the number of rows and columns in array 32 will depend on the particular implementation of image sensor 14. While rows and columns are generally described herein as being horizontal and vertical, respectively, rows and columns may refer to any grid-like structure. Features described herein as rows may be arranged vertically and features described herein as columns may be arranged horizontally.

Pixel array 32 may be provided with a color filter array having multiple color filter elements which allows a single image sensor to sample light of different colors. As an example, image sensor pixels such as the image pixels in array 32 may be provided with a color filter array which allows a single image sensor to sample red, green, and blue (RGB) light using corresponding red, green, and blue image sensor pixels. The red, green, and blue image sensor pixels may be arranged in a Bayer mosaic pattern. The Bayer mosaic pattern consists of a repeating unit cell of two-by-two image pixels, with two green image pixels diagonally opposite one another and adjacent to a red image pixel diagonally opposite to a blue image pixel. In another example, broadband image pixels having broadband color filter elements (e.g., clear color filter elements) may be used instead of green pixels in a Bayer pattern. These examples are merely illustrative and, in general, color filter elements of any desired color (e.g., cyan, yellow, red, green, blue, etc.) and in any desired pattern may be formed over any desired number of image pixels 34.

Image sensors typically include imaging pixels configured to sense visible light (e.g., light in the visible spectrum from about 580 to 900 nanometers). Certain imaging applications have adopted near infrared (NIR) sensors that include imaging pixels configured to sense NIR light in the near infrared spectrum from about 950 to 1000 nanometers (nm). NIR sensing can, however, require emitting NIR light in the range of 950-1000 nm, which, if care is not taken, can cause harm to human eyes.

A light-sensing pixel for an image sensor may accumulate charge that can negatively affect the sensing of light during an exposure period of a frame. Accordingly, the pixel may be reset before the exposure to drain the unwanted charge. To reset the pixel, a photodiode of the light-sensing pixel may be electrically coupled to a reset voltage by a conductive channel generated by a reset gate of the light-sensing pixel. When the reset gate is turned ON, charge may flow, as current, through the conductive channel to a reset voltage source. The flow may continue for a reset period until the charge is drained. A long reset period is a technical problem because it can limit the maximum frame rate of the image sensor, and increasing the reset voltage to reduce the reset period may not be a practical solution because higher voltages may violate standards for reliability. The present disclosure describes a light-sensing pixel that can reduce a reset period without requiring the use of high voltages. The technical effect of the disclosed light-sensing pixel may be an increased frame rate and/or a more complete reset of light-sensing pixels for an image sensor having a global shutter. A technical advantage of this approach is that the fabrication process requires no added steps for the light-sensing pixel to achieve this reset performance.

Figure 3:
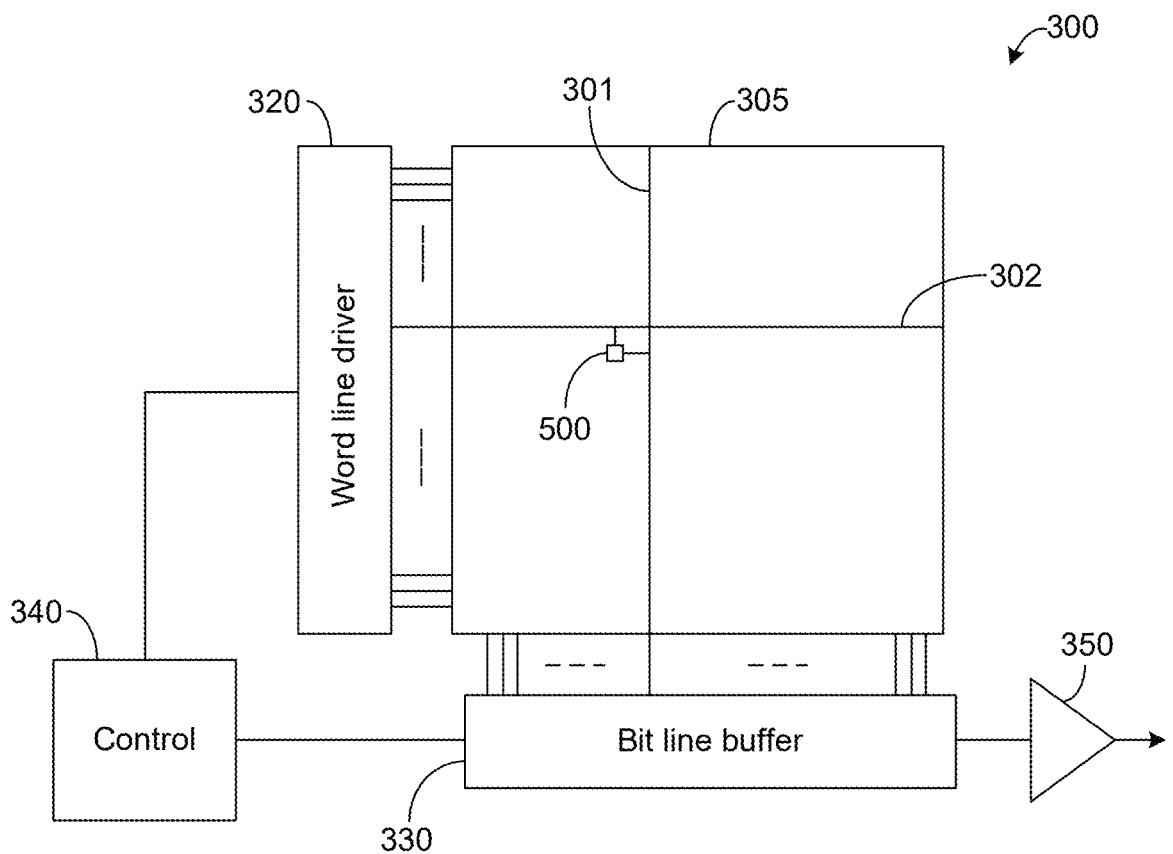
FIG. 3 is a schematic block diagram of an image sensor according to a possible implementation of the present disclosure.

FIG. 3 is a schematic block diagram of an image sensor according to a possible implementation of the present disclosure. The image sensor 300 can include an array of light-sensing pixels (i.e., pixel array 305). Each light-sensing pixel (i.e., pixel) is configured to generate charge corresponding to light incident on the pixel. The charge can be converted to a voltage, which can be amplified by an amplifier 350 at an output of the image sensor 300.

A light-sensing pixel 500 can be addressed based on its row and column in the pixel array 305. For example, the light-sensing pixel 500 may be coupled (e.g., by a switch or switches) to a word line 302 corresponding to a row in the pixel array 305. The light-sensing pixel 500 may be further coupled (e.g., by a switch or switches) to a bit line 301 corresponding to a column in the pixel array 305.

All the pixels can be exposed to light simultaneously (i.e., global shutter) so that an amount of charge is generated in each pixel based on the light at each pixel. The charge generated in each light-sensing pixel 500 can be read out (i.e., output) row-by-row and column-by-column. For example, to read out the charge from the light-sensing pixel 500, a controller 340 may configure a word-line driver 320 to couple the light-sensing pixels in a row to their corresponding bit line. The controller 340 may further configure a bit-line driver 330 to transfer this charge to the amplifier 350 sequentially for each pixel in the row. The amplifier 350 may be configured to output a voltage corresponding to the charge for each pixel.

A frame can include the exposure and readout of all pixels of the pixel array 305. In an image sensor 300 with a global shutter, all pixels are exposed simultaneously to light. The global shutter has an advantage when compared to a row-by-row exposure approach (e.g., rolling shutter) because artifacts created by a moving target can be reduced (e.g., eliminated). The global shutter may require more time than a rolling shutter because the readout of all rows occurs before the next frame begins.

Light may be focused (i.e., imaged) on the pixel array 305 so that the image sensor 300 can generate a two-dimensional image corresponding to the focused light on a frame-by-frame basis. The speed at which images can be captured is known as the frame rate and it may be desirable to increase the frame rate in order to capture fast moving objects.

Figure 4:
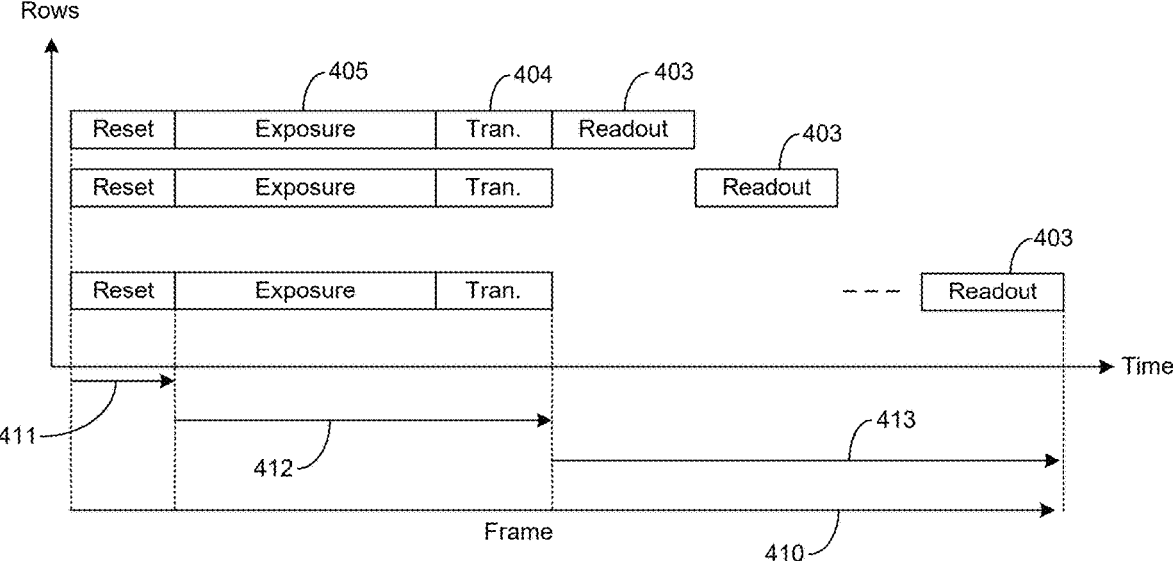
FIG. 4 is a graph showing the timing of a frame for an image sensor according to a possible implementation of the present disclosure.

FIG. 4 is a graph showing the timing of a frame for an image sensor according to a possible implementation of the present disclosure. The image sensor includes a global shutter in which all rows are exposed for an exposure period 412 before a readout period 413 begins.

As shown in FIG. 4, all rows in the pixel array 305 are exposed to light at the same time during the exposure period 412. During the exposure period 412, photodiodes in each pixel generate and accumulate charge based on photons of light received during the exposure period 412. In addition to an exposure portion 405, the exposure period 412 further includes a transfer portion 404 (i.e., TRAN.), during which the charge, which was accumulated in the photodiode region of the light sensing pixel during the exposure portion 405, is transferred to a storage node of the light sensing pixel.

As shown in FIG. 4, the frame 410 for the global-shutter image sensor further includes a readout period 413. Each row may be readout in sequence (e.g., from top row to bottom row) so that the readout period 413 can be the cumulative total of each row-readout period 403.

As shown in FIG. 4, a frame 410 further includes a reset period 411. All rows in the pixel array 305 can be reset at the same time. During the reset period 411, charge in the pixels due to sources (e.g., thermal noise, dark current, etc.) can be drained (e.g., reset) before the exposure period 412 begins in the frame. The reset may reduce noise in the captured image and can increase the dynamic range of the image sensor 300, but the reset can ultimately limit the speed (i.e., frame rate) of the image sensor 300, especially if the reset period 411 is long (e.g., with respect to the frame 410). Accordingly, minimizing the reset period 411 may help improve the performance of the image sensor 300.

Figure 5:
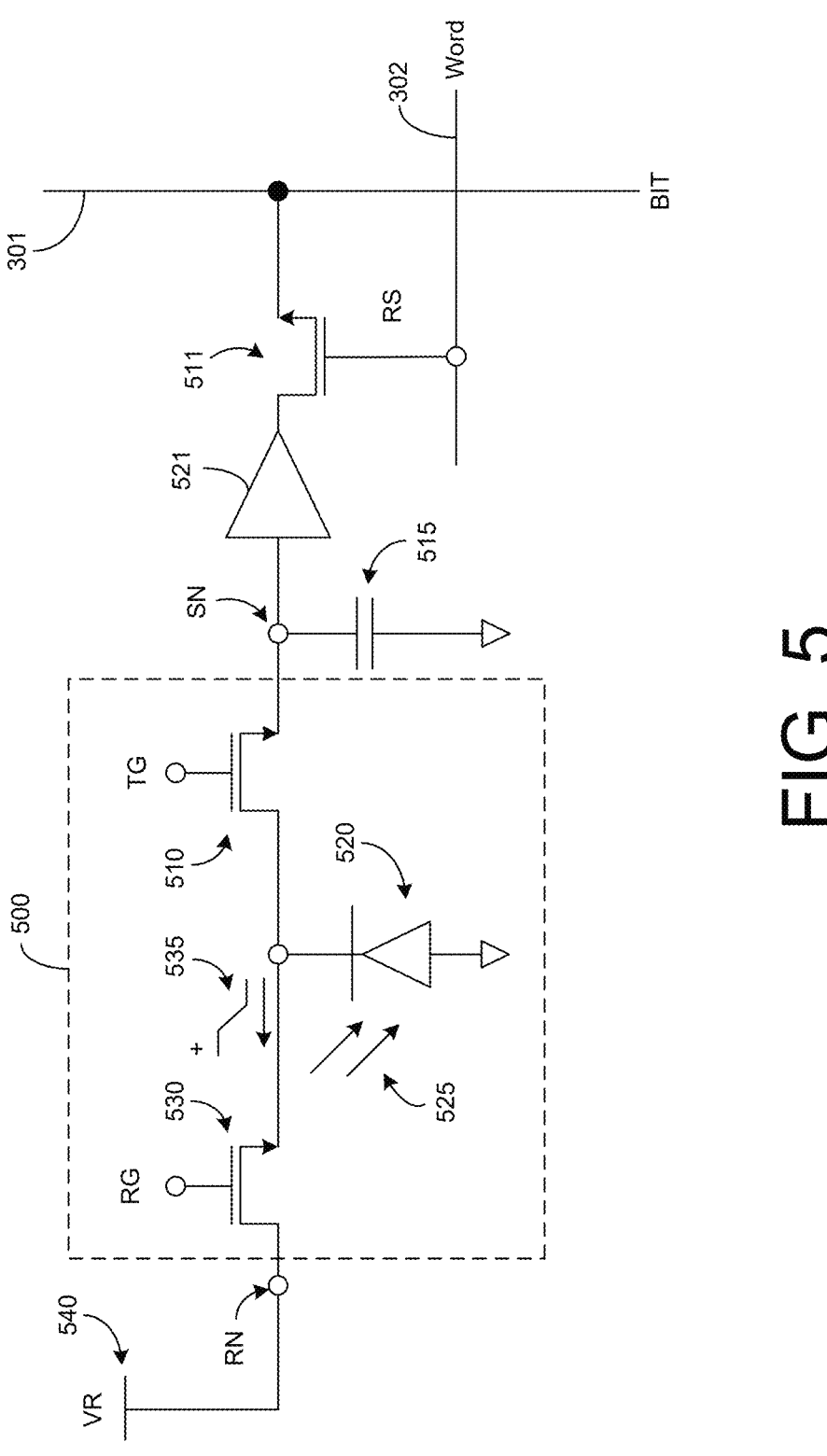
FIG. 5 is schematic of a light-sensing pixel for an image sensor according to a possible implementation of the present disclosure.

FIG. 5 is schematic of a light-sensing pixel for an image sensor according to a possible implementation of the present disclosure. The light-sensing pixel 500 includes a photodiode 520 configured to generate change (i.e., charge carriers) as a result of being exposed to light 525.

The light-sensing pixel 500 further includes a transfer transistor 510 controlled by a transfer gate signal (TG) at a transfer gate. During a row-readout period 403, the transfer gate signal (TG) may be configured the transfer transistor 510 in an ON condition. As shown, the transfer transistor 510 may be an n-type metal oxide semiconductor transistor (MOSFET) configured to conduct charge (i.e., current) through a conductive channel between a source terminal and a drain terminal while a transfer gate signal (TG) generates a voltage above the threshold voltage of the transfer transistor 510. Accordingly, while in the ON condition, the transfer transistor 510 may electrically couple the photodiode 520 to a storage node (SN) so that charge generated by the photodiode 520 can be stored in a storage-node capacitor 515 for readout. The readout may include driving a word line 302 to configure a row-select transistor 511 in an ON condition so that the stored charge in the storage-node capacitor 515 can be coupled to a bit line 301 via a buffer amplifier 521.

The light-sensing pixel 500 further includes a reset transistor 530 controlled by a reset gate signal (RG) at a reset gate. During a reset period 411, the reset gate signal (RG) may be configured the reset transistor 530 in an ON condition. As shown, the reset transistor 530 may be an n-type metal oxide semiconductor transistor (MOSFET) configured to conduct charge (i.e., current) through a conductive channel between a source terminal and a drain terminal while a reset gate signal (RG) generates a voltage above a threshold voltage of the transfer transistor 510. Accordingly, while in the ON condition, the reset transistor 530 may electrically couple the photodiode 520 to a reset node (RN) so that unwanted charge generated by the photodiode 520 can be conducted to a reset-voltage source 540. In other words, a reset voltage (VR) is applied to the reset-node (RN) during a reset period to drain charge from the photodiode through a conductive channel created in the reset transistor 530 by the reset gate signal (RG).

At the end of the reset period 411 some charge may remain in the conductive channel of the reset transistor 530. To prevent this charge from draining back into the photodiode 520 (i.e., spillback), a potential barrier 535 is configured between the conductive channel of the reset transistor 530 and the photodiode 520. In other words, the potential barrier may make the conduction during reset unidirectional (i.e., one way). While helping to prevent spillback, the potential barrier can resist the flow of charge during reset. In other words, the potential barrier may counteract the charge-draining effect of the reset voltage at the reset-node. As a result, the drain rate of the photodiode 520 may be reduced by the potential barrier 535. Raising the reset voltage in order to overcome the reduction may be limited by safety and reliability concerns. As a result, the reset period 411 may be longer than desired for some applications. The light-sensing pixel 500 includes a structure to reduce the potential barrier 535 to increase a drain rate of the photodiode 520 during the reset period 411. The disclosed reduction can be selected to balance spillback protection with reset speed.

Figure 6:
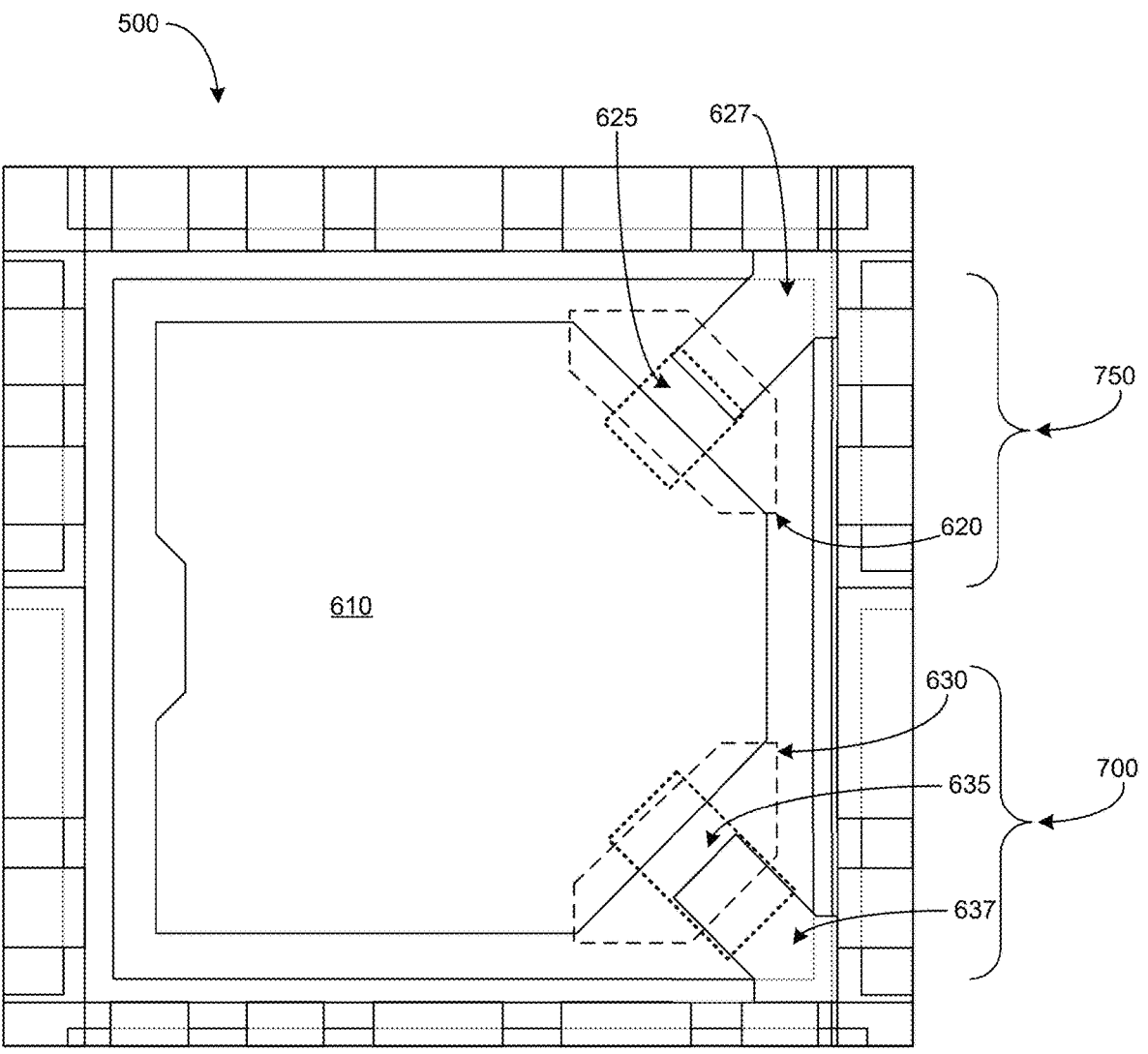
FIG. 6 is a top view of a light-sensing pixel according to a possible implementation of the present disclosure.

FIG. 6 is a top view of a light-sensing pixel according to a possible implementation of the present disclosure. The light-sensing pixel 500 includes a photodiode region 610.

The light-sensing pixel 500 further includes a transfer gate 630 configured to generate a conductive channel under the transfer gate 630 between the photodiode region 610 and a storage-node region 637 while a voltage (i.e., transfer-gate signal) is applied to the transfer gate 630. The light-sensing pixel 500 includes an anti-blooming layer 635 below the transfer gate 630. The anti-blooming layer 635 can be configured as a drain for excess charge generated by the photodiode region 610 during an exposure period 412 to prevent this excess charge from overflowing into neighboring pixels.

As shown in FIG. 6, the light-sensing pixel 500 further includes a reset gate 620 configured to generate a conductive channel under the reset gate 620 between the photodiode region 610 and a reset-node region 627 while a voltage (i.e., reset-gate signal) is applied to the reset gate 620. The light-sensing pixel 500 includes a photodiode-extension layer 625 below the reset gate 620. The photodiode-extension layer can be configured to reduce a potential barrier between the photodiode region 610 and the conductive channel under the reset gate 620. The light-sensing pixel 500 is a multi-layer semiconductor device. The photodiode-extension layer 625 and the anti-blooming layer 635 can be on the same layer within the multiple layers.

The regions in the following exemplary figures may be specified spatially as they appear in the figure, with terms such as top, upper, front, or above being used to indicate features that are higher on the page than features specified by terms, such as bottom, lower, back, or below. In practice, the shape and scale of the regions may vary without departing from the basic spatial relationships shown and described herein.

The following exemplary figures illustrate portions of a silicon device with regions and layers designated based on their doping. The doping can be made using a semiconductor process, such as ion-implantation. An ion-implantation process can include masking a silicon substrate and implanting ions into the unmasked region (or regions).

Figure 7A:
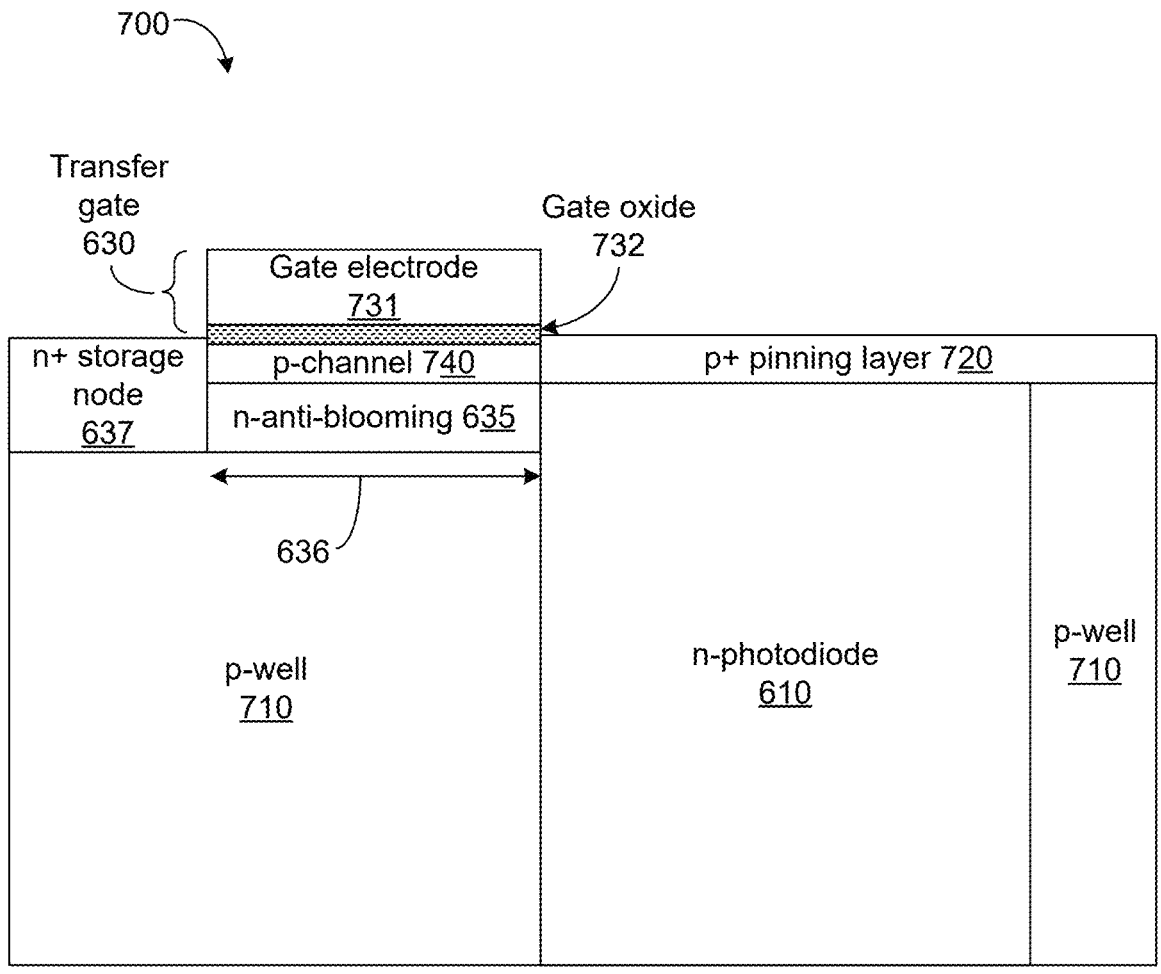
FIG. 7A is a cross-sectional view of a transfer-gate portion of a light-sensing pixel according to a possible implementation of the present disclosure.

FIG. 7A is a cross-sectional view of a transfer-gate portion of a light-sensing pixel according to a possible implementation of the present disclosure. The transfer-gate portion 700 of the light-sensing pixel 500 includes a plurality of regions and layers. The transfer-gate portion 700 includes the photodiode region 610. The photodiode region 610 may be an n-type (e.g., n-type with a carrier concentration of approximately $1 \times 10^{16}$/cm$^3$) silicon (Si) configured to collect photogenerated electrons. The photodiode region may be between a p-well region 710 (e.g., p type with a carrier concentration of approximately $1 \times 10^{17}$/cm$^3$) configured to isolate the n-type regions of the device. A pinning layer 720 (e.g., p+ type with a carrier concentration of approximately $1 \times 10^{18}$/cm$^3$) is at a top surface of photodiode region 610 and is configured to provide surface passivation in order to reduce dark current in the photodiode region 610 due to the air-surface interface. The transfer-gate portion 700 further includes a transfer channel layer 740 (e.g., p-type with a carrier concentration of approximately $3 \times 10^{17}$/cm$^3$) extending a channel length between the photodiode region 610 and a storage-node region 637 (n+ type with a carrier concentration of approximately $1 \times 10^{20}$/cm$^3$). The storage-node region 637 can be configured as a junction capacitor to store electrons transferred from the photodiode region 610. The transfer-gate portion 700 further includes an anti-blooming layer 635 (i.e., anti-blooming channel, buried channel) at a bottom surface of the transfer channel layer 740. The bottom surface of the channel layer is opposite the top surface of the channel layer. The anti-blooming layer 635 extends along the bottom surface of the transfer channel layer 740 between the photodiode region 610 and the storage-node region 637. In other words, the anti-blooming layer 635 has an anti-blooming channel length 636 equal to the channel length of the transfer channel layer 740.

The transfer-gate portion 700 further includes a transfer gate 630. The transfer gate includes a transfer gate electrode 731 (e.g., polysilicon n-type with a carrier concentration of $1 \times 10^{18}/cm^3$) separated from a top surface of the transfer channel layer 740 by a transfer gate oxide layer 732. The transfer gate oxide layer insulates the p-type channel layer from the polysilicon gate electrode. In other words, the transfer gate 630 and the transfer channel layer 740 form a metal oxide semiconductor (MOS) gate, which generates a conductive channel (e.g., inversion layer) between the photodiode region 610 and the storage-node region 637 when a voltage is applied the transfer gate electrode 731. The conductive channel can be turned OFF when a no voltage is applied to the transfer gate electrode 731 to suppress dark current. The anti-blooming layer 635 may be configured to operate as a junction field effect transistor in parallel with the MOS gate to access excess charge (e.g., electrons) from the photodiode region 610.

Figure 7B:
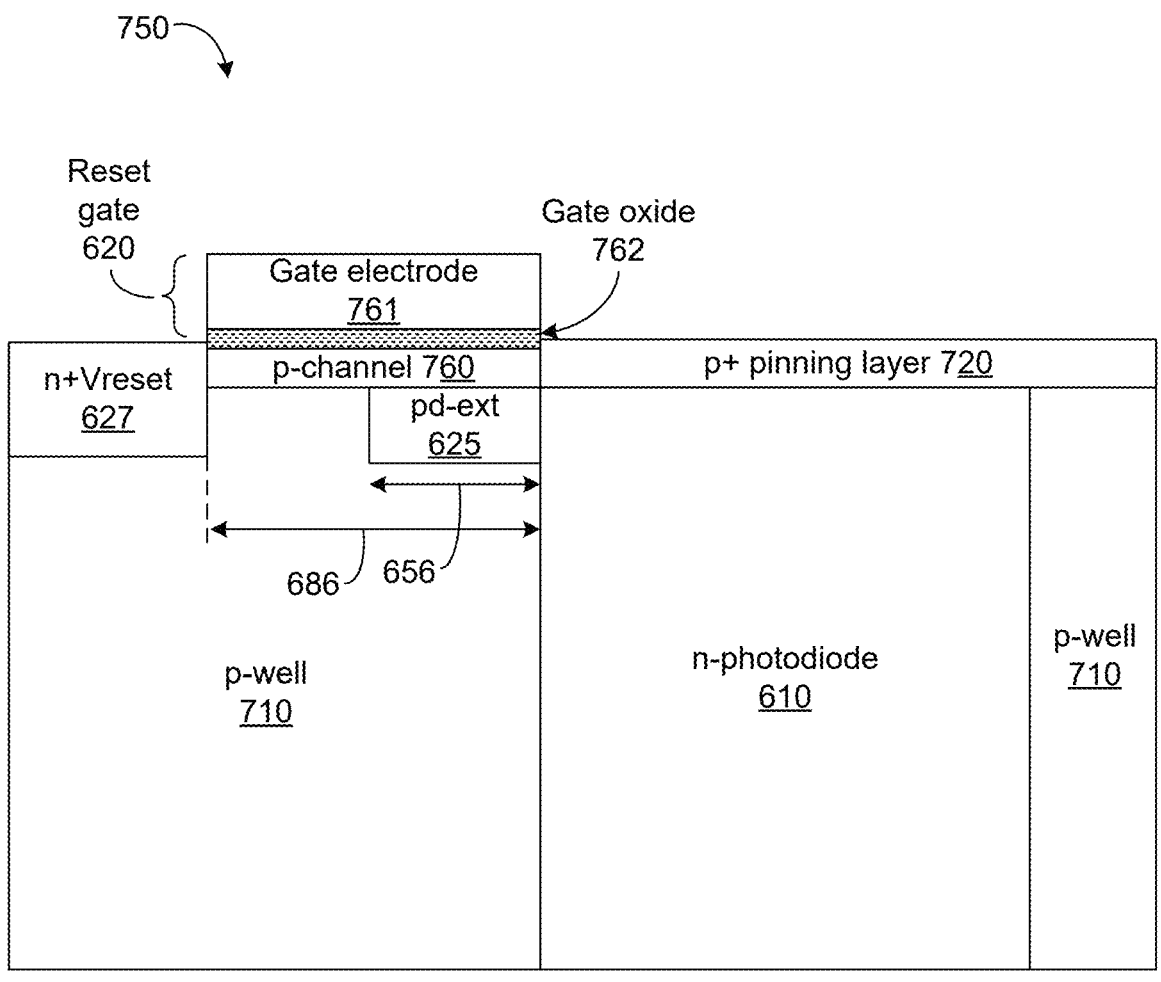
FIG. 7B is a cross-sectional view of a reset-gate portion of a light-sensing pixel according to a possible implementation of the present disclosure.

FIG. 7B is a cross-sectional view of a reset-gate portion of a light-sensing pixel according to a possible implementation of the present disclosure. The reset-gate portion 750 of the light-sensing pixel 500 includes a plurality of regions and layers. The reset-gate portion 750 includes the photodiode region 610. As shown, the photodiode region (i.e., photodiode) is between the p-well region 710. The pinning layer 720 is included at a top surface of photodiode region 610. The reset-gate portion 750 further includes a transfer channel layer 740 (i.e., reset channel layer) extending the anti-blooming channel length 636 between the photodiode region 610 and the reset-node region 627 (n+ type with a carrier concentration of approximately $1 \times 10^{20}/cm^3$). The reset-node region 627 can be coupled to a reset power supply (i.e., reset voltage source (VR)).

The reset-gate portion 750 further includes a photodiode-extension layer 625 (i.e., partial buried channel) at a bottom surface of the reset channel layer 760. The photodiode-extension layer 625 extends from the photodiode region 610 along a portion of the bottom surface of the reset channel layer 760. In other words, the photodiode-extension layer 625 has an extension length 656 that is less than the channel length 686 between the photodiode region 610 and the reset-node region 627. The extension length 656 may be in a range of about ¼ to ¾ the channel length. For example, the extension length 656 can be ½ the channel length 686.

The reset-gate portion 750 further includes a reset gate 620. The reset gate 620 includes a reset gate electrode 761 (e.g., polysilicon n-type with a carrier concentration of $1 \times 10^{18}/cm^3$) separated from a top surface of the reset channel layer 760 (e.g., p type with a carrier concentration of approximately $3 \times 10^{17}/cm^3$) by a reset gate oxide layer 762. The reset gate oxide layer insulates the p-type channel layer from the polysilicon gate electrode. In other words, the reset gate 620 and the reset channel layer 760 form a metal oxide semiconductor (MOS) gate, which generates a conductive channel (e.g., inversion layer) between the photodiode region 610 and the reset-node region 627 when a voltage is applied the reset gate electrode 761. The conductive channel can be turned OFF when a no voltage is applied to the reset gate electrode 761 to conduction.

The photodiode-extension layer 625 may be shorter than the anti-blooming layer 635. The photodiode-extension layer 625 and the anti-blooming layer 635 may be on the same layer (i.e., a common layer) of the light-sensing pixel. The photodiode-extension layer 625 and the anti-blooming layer 635 can be fabricated using one mask. In other words, the photodiode-extension layer 625 can be added to a light-sensing pixel 500 with an anti-blooming layer 635 without a significant impact to the fabrication process.

Figure 8A:
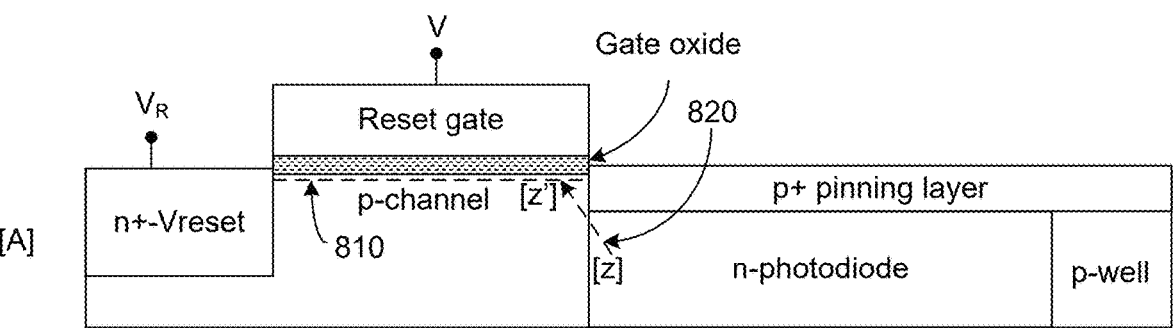
FIG. 8A is a cross-sectional view illustrating a drain path of a reset-gate portion of a light-sensing pixel without a photodiode-extension layer.

FIG. 8A is a cross-sectional view illustrating a drain path ([z]-[z']) of a reset-gate portion of a light-sensing pixel without a photodiode-extension layer (i.e., no buried channel). As shown, a conductive channel 810 is generated in the reset channel layer when a rest-gate voltage (V) is applied to the reset gate. The conductive channel 810 is configured to drain (i.e., conduct) charge from the photodiode region to the conductive channel 810 along a drain path 820.

Figure 8B:
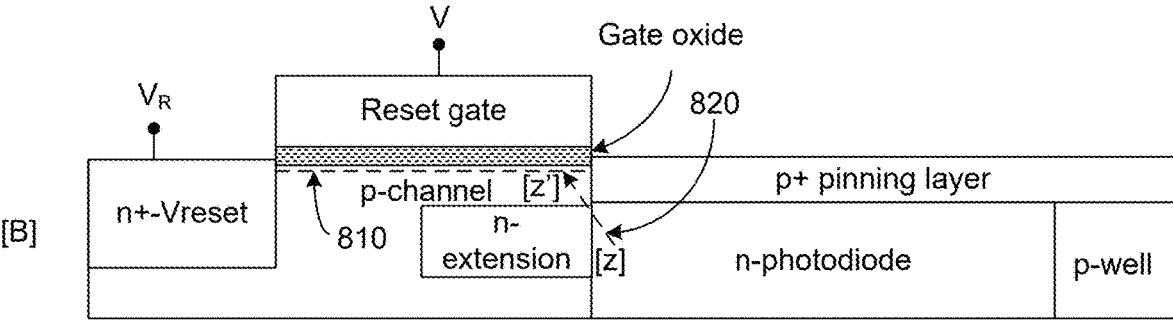
FIG. 8B is a cross-sectional view illustrating a drain path of a reset-gate portion of a light-sensing pixel with a photodiode-extension layer.

FIG. 8B is a cross-sectional view illustrating the drain path ([z]-[z']) of the reset-gate portion of a light-sensing pixel with the photodiode-extension layer (i.e., buried channel). As shown, the conductive channel 810 is generated in the reset channel layer when a rest-gate voltage (V) is applied to the reset gate. The conductive channel 810 is configured to drain (i.e., conduct) charge from the photodiode region to the conductive channel 810 along the drain path 820.

Figure 9:
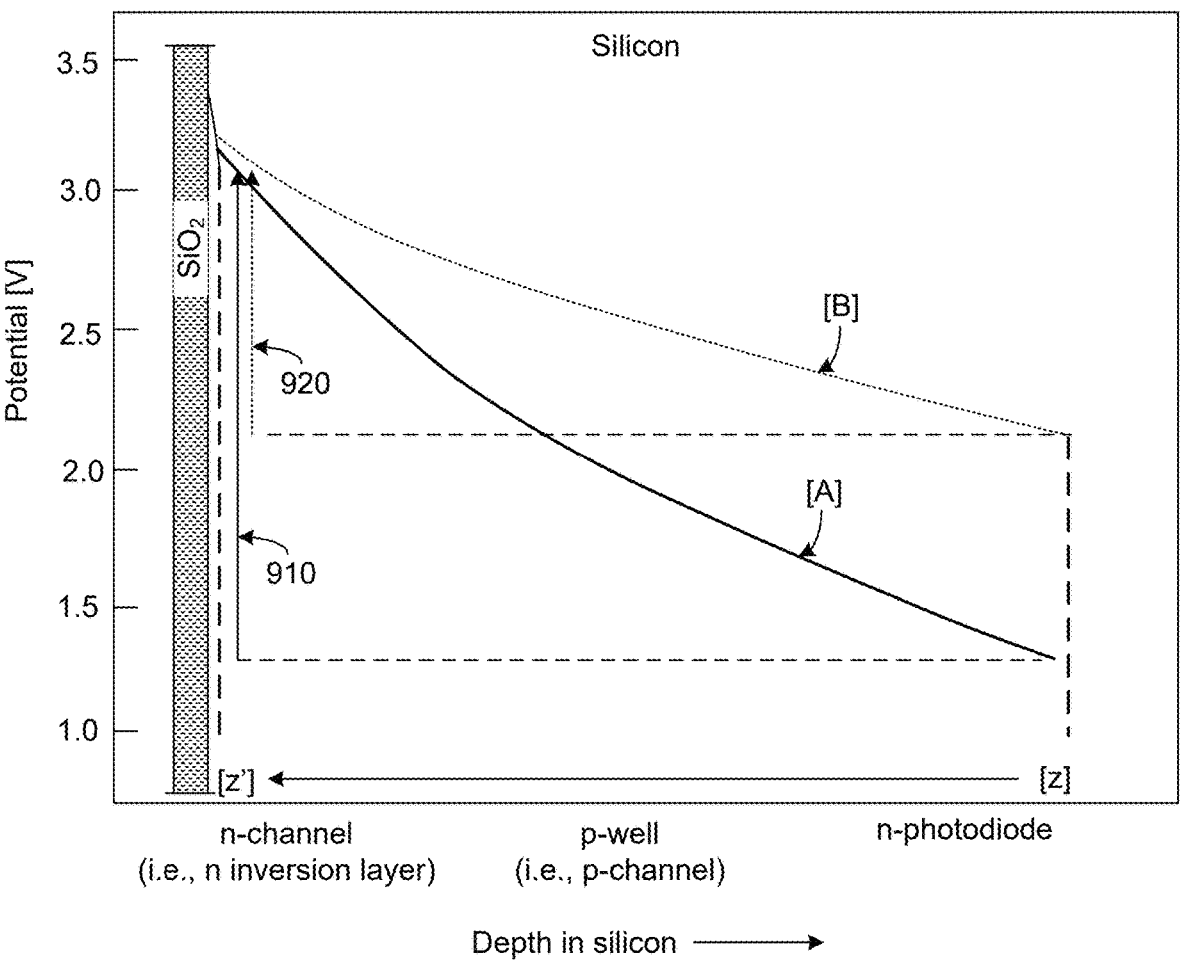
FIG. 9 is a graph illustrating the potential barrier along the drain path for light-sensing pixels with and without the photodiode-extension layer according to a possible implementation of the present disclosure.

FIG. 9 is a graph illustrating the potential barrier along the drain path 820 ([z]-[z']) for the implementations without a photodiode extension layer (i.e., [A]) and with the photodiode extension layer (i.e., [B]). The graph illustrates the potential along the drain path 820 illustrated in FIG. 8A and FIG. 8B. The potential barrier is defined as the difference in potential between the photodiode and the conductive channel (i.e., n-type inversion layer). As shown, the first potential barrier 910 without the photodiode extension layer (see FIG. 8A) is greater than the second potential barrier 920 with the photodiode extension layer (see FIG. 8B).

Figure 10:
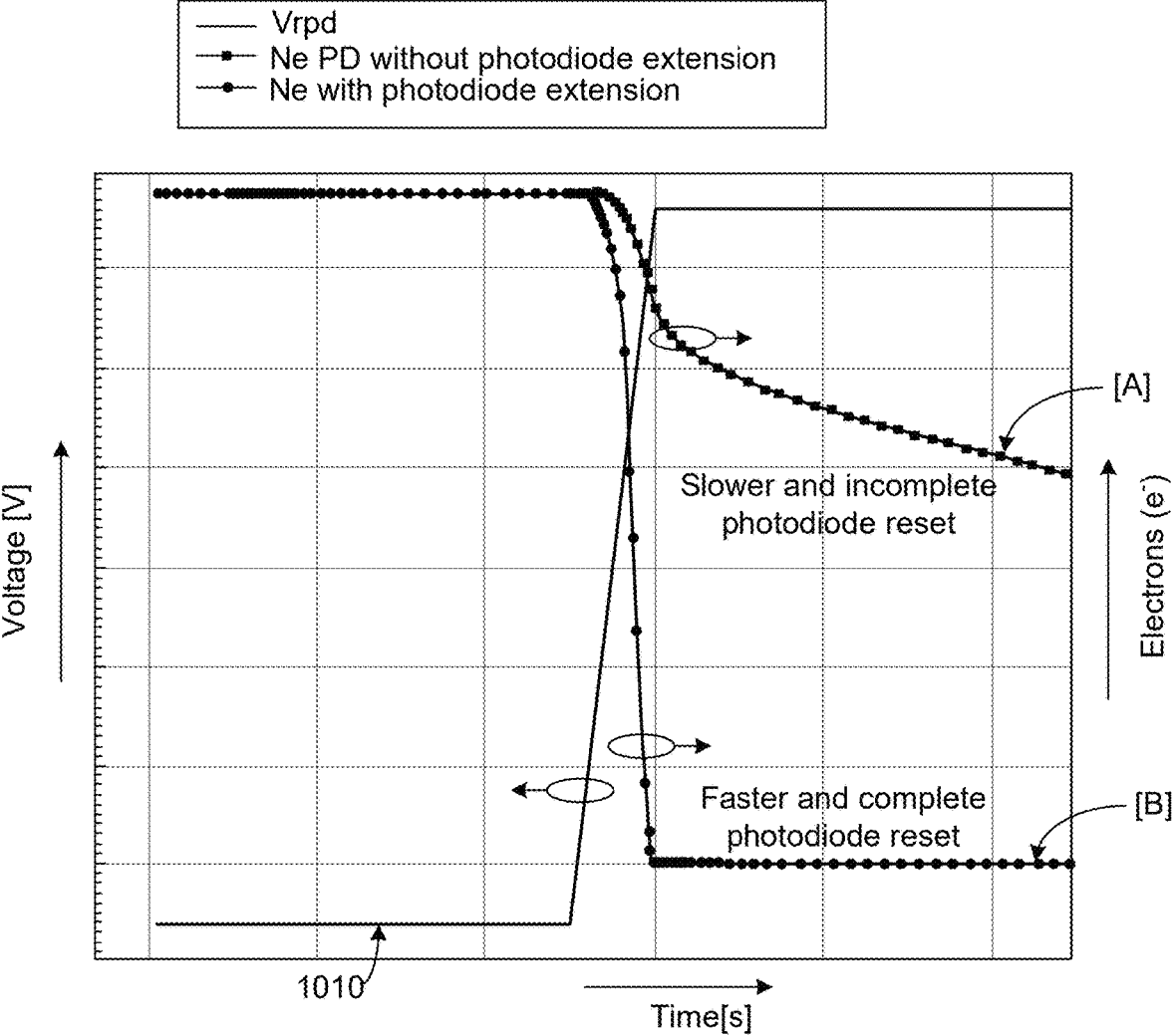
FIG. 10 is a graph illustrating a reset period for the light-sensing pixels with and without the photodiode-extension layer according to a possible implementation of the present disclosure.

FIG. 10 is a graph illustrating a reset period for the light-sensing pixels with and without the photodiode-extension layer according to a possible implementation of the present disclosure. As shown, a reset voltage 1010 is turned ON (e.g., raised from a negative voltage to a positive voltage) at the beginning of a reset period. As shown, the charge is drained at a first drain rate that is faster when the photodiode-extension layer is present (i.e., [B]) than the second drain rate when the photodiode-extension layer is not present (i.e., [A]). Accordingly, a reset period to completely drain the charge from the photodiode may be shorter when the photodiode-extension layer is included.

FIG. 11 is a flowchart of a method for resetting a light-sensing pixel according to an implementation of the present disclosure. The method 1100 includes generating 1110 charge in a photodiode region of the light-sensing pixel. The method 1100 further includes applying 1120 a reset voltage to a reset-node region to drain the generated charge. The reset-node region is separated from the photodiode region by a channel layer having a channel length, and a photodiode extension layer partially covers the bottom surface of the channel layer. In other words, the photodiode extension layer has an extension length that is less than the channel length. The method 1100 further includes applying 1130 a reset-gate voltage to a reset gate adjacent to a channel layer between the photodiode region and the reset-node region. The method 1100 further includes generating 1140 a conductive channel in the channel layer between the photodiode region and the reset-node region in response to the reset-gate voltage. The method 1100 further includes draining 1150 the charge from the photodiode region through the conductive channel to reset the light-sensing pixel.

In the specification and/or figures, typical embodiments have been disclosed. The present disclosure is not limited to such exemplary embodiments. The use of the term "and/or" includes any and all combinations of one or more of the associated listed items. The figures are schematic representations and so are not necessarily drawn to scale. Unless otherwise noted, specific terms have been used in a generic and descriptive sense and not for purposes of limitation.

Unless defined otherwise, all technical and scientific terms used herein have the same meaning as commonly understood by one of ordinary skill in the art. Methods and materials similar or equivalent to those described herein can be used in the practice or testing of the present disclosure. As used in the specification, and in the appended claims, the singular forms "a," "an," "the" include plural referents unless the context clearly dictates otherwise. The term "comprising" and variations thereof as used herein is used synonymously with the term "including" and variations thereof and are open, non-limiting terms. The terms "optional" or "optionally" used herein mean that the subsequently described feature, event or circumstance may or may not occur, and that the description includes instances where said feature, event or circumstance occurs and instances where it does not. Ranges may be expressed herein as from "about" one particular value, and/or to "about" another particular value. When such a range is expressed, an aspect includes from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint.

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

It will be understood that, in the foregoing description, when an element is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element, there are no intervening elements present. Although the terms directly on, directly connected to, or directly coupled to may not be used throughout the detailed description, elements that are shown as being directly on, directly connected or directly coupled can be referred to as such. The claims of the application, if any, may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

The invention claimed is:

1. A light-sensing pixel, comprising:
a first channel layer adjacent to a photodiode region, adjacent to a reset-node region, and extending a first channel length to fill a space between the photodiode region and the reset-node region;
a reset gate adjacent to a top surface of the first channel layer and extending the first channel length so that a reset-gate voltage applied to the reset gate generates a first conductive channel between the photodiode region and the reset-node region;
a photodiode-extension layer adjacent to a bottom surface of the first channel layer opposite the top surface, the photodiode-extension layer extending from the photodiode region by an extension length that is less than the first channel length;
a second channel layer extending between the photodiode region and a storage-node region; and
an anti-blooming layer adjacent to the second channel layer.

2. The light-sensing pixel according to claim 1, wherein:
a reset voltage is applied to the reset-node region during a reset period to drain charge from the photodiode region through the first conductive channel at a drain rate.

3. The light-sensing pixel according to claim 2, wherein the photodiode-extension layer reduces a potential barrier between the photodiode region and the first conductive channel to increase the drain rate.

4. The light-sensing pixel according to claim 1, wherein the first conductive channel is an inversion layer adjacent to the reset gate at the top surface of the first channel layer.

5. The light-sensing pixel according to claim 1, wherein the photodiode region is an n-type semiconductor, the reset-node region is the n-type semiconductor, and the first channel layer is a p-type semiconductor.

6. The light-sensing pixel according to claim 1, wherein the extension length is in a range of ¼ the first channel length to ¾ the first channel length.

7. The light-sensing pixel according to claim 1, wherein the reset gate includes:
an insulating oxide layer between the top surface of the first channel layer and an n-type polysilicon gate electrode.

8. The light-sensing pixel according to claim 1, wherein:
the second channel layer extends a second-channel length; and
the anti-blooming layer extends the second-channel length.

9. The light-sensing pixel according to claim 1, wherein:
the photodiode-extension layer and the anti-blooming layer are on a common fabrication layer of the light-sensing pixel.

10. The light-sensing pixel according to claim 8, further comprising:

a transfer gate adjacent to the top surface of the second channel layer and extending the second-channel length so that a transfer-gate voltage applied to the transfer gate generates a second conductive channel between the photodiode region and the storage-node region.

11. A light-sensing pixel comprising:

a photodiode configured to generate charge based on received light;

a reset transistor coupled between the photodiode and a reset-node, the reset transistor including:

a reset gate;

a first channel layer adjacent to the reset gate at a top surface, the first channel layer configured to generate a first conductive channel between the photodiode and the reset-node while a reset-gate voltage is applied to the reset gate; and a buried channel at a bottom surface of the first channel layer opposite the top surface, the buried channel having an extension length that is less than a channel length of the first channel layer in a direction aligned with the first conductive channel; and a transfer transistor coupled between the photodiode and a storage-node, the transfer transistor including:

a transfer gate;

a second channel layer extending between a photodiode region and a storage-node region; and an anti-blooming channel adjacent to the second channel layer.

12. The light-sensing pixel according to claim 11, wherein:

a reset voltage is applied to the reset-node while the reset-gate voltage is applied to the reset gate during a reset period to drain the charge from the photodiode through the first conductive channel at a drain rate.

13. The light-sensing pixel according to claim 12, wherein the buried channel reduces a potential barrier between the photodiode and the reset transistor to increase the drain rate.

14. The light-sensing pixel according to claim 11, wherein the first conductive channel is an inversion layer in the first channel layer.

15. The light-sensing pixel according to claim 11, wherein the reset transistor is an n-type metal oxide semiconductor field-effect transistor.

16. The light-sensing pixel according to claim 11, wherein the extension length is in a range of ¼ the channel length to ¾ the channel length.

17. The light-sensing pixel according to claim 11, wherein:

the second channel layer is adjacent to the transfer gate at a top surface of the second channel layer, the second channel layer configured to generate a second conductive channel between the photodiode and the storage-node while a transfer-gate voltage is applied to the transfer gate; and the anti-blooming channel at a bottom surface of the second channel layer opposite the top surface, the anti-blooming channel extending an anti-blooming channel length that is longer than the extension length.

18. The light-sensing pixel according to claim 17, wherein:

the buried channel and the anti-blooming channel are fabrication on a common layer of the light-sensing pixel.

19. A method for resetting a light-sensing pixel, the method comprising:

generating a first charge in a photodiode region of the light-sensing pixel;

applying a reset voltage to a reset-node region of the light-sensing pixel, the reset-node region separated from the photodiode region by a first channel layer, the light-sensing pixel including a photo-diode extension layer partially covering a bottom surface of the first channel layer;

applying a reset-gate voltage to a reset gate adjacent to the first channel layer;

generating a conductive channel between the photodiode region and the reset-node region in response to the reset-gate voltage;

draining the first charge from the photodiode region through the conductive channel to reset the light-sensing pixel;

accumulating a second charge in the photodiode region of the light-sensing pixel during an exposure period; and applying a voltage to a transfer gate on a top surface of a second channel layer to couple the second charge to a storage node, the transfer gate extending a second channel length between the photodiode region and a storage-node region, and the transfer gate including an anti-blooming layer adjacent to a bottom surface of the second channel layer and extending the second channel length.

20. The method according to claim 19, wherein the photo-diode extension layer partially covering the bottom surface of the first channel layer reduces a barrier potential to decrease a time required to reset the light-sensing pixel.

\* \* \* \* \*